United States Patent
Choi et al.

(10) Patent No.: US 8,296,636 B2
(45) Date of Patent: Oct. 23, 2012

(54) APPARATUS AND METHOD FOR GENERATING LOW DENSITY PARITY CHECK CODE

(75) Inventors: Seung-Hoon Choi, Seoul (KR);
Sung-Eun Park, Seoul (KR);
Song-Nam Hong, Suwon-si (KR);
Ho-Kyu Choi, Seongnam-si (KR);
Jae-Weon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 904 days.

(21) Appl. No.: 12/396,857

(22) Filed: Mar. 3, 2009

(65) Prior Publication Data
US 2009/0228758 A1 Sep. 10, 2009

(30) Foreign Application Priority Data
Mar. 5, 2008 (KR) ........................ 10-2008-0020742

(51) Int. Cl.
*H03M 13/03* (2006.01)

(52) U.S. Cl. .................... 714/786; 714/792; 714/794

(58) Field of Classification Search ............... 714/786, 714/792, 794
See application file for complete search history.

(56) References Cited

U.S. PATENT DOCUMENTS

| | | | | |
|---|---|---|---|---|
| 7,225,392 | B2 * | 5/2007 | Huang et al. ............... | 714/786 |
| 7,502,987 | B2 * | 3/2009 | Kyung et al. .............. | 714/781 |
| 7,802,164 | B2 * | 9/2010 | Hong et al. ................ | 714/752 |
| 7,882,414 | B2 * | 2/2011 | Choi et al. ................. | 714/752 |
| 2003/0066020 | A1 * | 4/2003 | Morita et al. .............. | 714/794 |
| 2007/0086539 | A1 * | 4/2007 | Hocevar ..................... | 375/267 |
| 2008/0092025 | A1 * | 4/2008 | Hedayat et al. ............ | 714/792 |
| 2008/0109708 | A1 * | 5/2008 | Kim et al. .................. | 714/790 |
| 2009/0259913 | A1 * | 10/2009 | Myung et al. ............. | 714/752 |

* cited by examiner

*Primary Examiner* — Joshua Lohn
(74) *Attorney, Agent, or Firm* — Jefferson IP Law, LLP

(57) ABSTRACT

A Low Density Parity Check (LDPC) encoding apparatus and method are provided. The LDPC encoding apparatus includes a controller for determining a number of zeros b to be inserted in an input information vector when a length of the input information vector is less than a length of a use information vector of a parity-check matrix, for selecting b stopping sets $S_d$ using the parity-check matrix, for selecting one variable node from each of the b stopping sets $S_d$ using a selection scheme, and for determining positions corresponding to the selected variable node from each of the b stopping sets $S_d$ as positions where zeros are to be inserted.

16 Claims, 4 Drawing Sheets

APPARATUS AND METHOD FOR GENERATING LOW DENSITY PARITY CHECK CODE

PRIORITY

This application claims the benefit under 35 U.S.C. §119 (a) of a Korean patent application filed on Mar. 5, 2008 in the Korean Intellectual Property Office and assigned Serial No. 10-2008-0020742, the entire disclosure of which is hereby incorporated by reference.

BACKGROUND OF THE INVENTION

1. Field of the Invention

The present invention relates to an apparatus and method for generating a Low Density Parity Check (LDPC) code. More particularly, the present invention relates to an apparatus and method for controlling positions where zeros are inserted in an input information vector to support various information vector lengths during the generation of the LDPC code.

2. Description of the Related Art

Next-generation communication systems are evolving to provide various high-speed and high-capacity services to Mobile Stations (MSs). Examples of the next-generation communication system include an Institute of Electrical and Electronics Engineers (IEEE) 802.16 communication system, a Worldwide Interoperability for Microwave Access (Mobile WiMAX) communication system and an IEEE 802.11 communication system. The Mobile WiMAX communication system is a communication system based on the IEEE 802.16 communication system and the IEEE 802.16 communication system is a communication system using the IEEE 802.16 standard.

The next-generation communication system considers using Low Density Parity Check (LDPC) codes to support high-speed transmission and reception of a large volume of data. The next-generation communication system considers using the LDPC codes because the LDPC code has a simple parallel implementation that enables implementation of a decoding apparatus having high throughput, compared to other channel codes, such as, Turbo codes and convolutional codes.

Meanwhile, various schemes such as a Hybrid Automatic Repeat reQuest (HARQ) and an Adaptive Modulation and Coding (AMC) have been proposed for the next-generation communication system to support high-speed transmission and reception of a large volume of data. The communication system should support various code rates to use HARQ and AMC.

However, the LDPC codes have the following shortcomings in terms of the code rate.

Since the LDPC code is generated using a parity-check matrix with a fixed size, a length of an information vector desired to be generated with the LDPC code should also be fixed. Therefore, when a length of an input information vector is not equal to a required information vector length, which is required when the parity-check matrix is used, the length of the input information vector must be matched to a required information vector length. For example, when the length of the input information vector is less than the required information vector length, it is necessary to insert zero in the input information vector so that the length of the zero-inserted information vector may be equal to the required information vector's length.

However, positions where zeros are inserted in the input information vector have not been proposed in detail.

Therefore, a need exists for an apparatus and method for controlling positions where zeros are inserted in an input information vector.

SUMMARY OF THE INVENTION

An aspect of the present invention is to address at least the above-mentioned problems and/or disadvantages and to provide at least the advantages described below. Accordingly, an aspect of the present invention is to provide an apparatus and method for generating a Low Density Parity Check (LDPC) code.

In accordance with one aspect of the present invention, a Low Density Parity Check (LDPC) encoding apparatus is provided. The LDPC encoding apparatus includes a controller for determining a number of zeros b to be inserted in an input information vector when a length of the input information vector is less than a length of a use information vector of a parity-check matrix, for selecting b stopping sets $S_d$ using the parity-check matrix, for selecting one variable node from each of the b stopping sets $S_d$ using a selection scheme, for determining positions corresponding to the selected variable node from each of the b stopping sets $S_d$ as positions where zeros are to be inserted and for outputting information on the positions where zeros are to be inserted.

In accordance with another aspect of the present invention, a Low Density Parity Check (LDPC) encoding apparatus is provided. The LDPC encoding apparatus includes a zero inserter for generating a use information vector by inserting a number of zeros b in an input information vector, and an encoder for generating an LDPC code by encoding the use information vector using a parity-check matrix. Positions where the b zeros are inserted are positions corresponding to b variable nodes, the b variable nodes include variable nodes which are selected from stopping sets $S_d$ one by one using a selection scheme and the stopping sets $S_d$ are selected using the parity-check matrix.

In accordance with still another aspect of the present invention, a method for generating a Low Density Parity Check (LDPC) code in an LDPC encoding apparatus is provided. The method includes determining a number of zeros b to be inserted in an input information vector when a length of the input information vector is less than a length of a use information vector of a parity-check matrix, selecting b stopping sets $S_d$ using the parity-check matrix, selecting one variable node from each of the b stopping sets $S_d$ using a selection scheme, and determining positions corresponding to the selected variable node from each of the b stopping sets $S_d$ as positions where zeros are inserted.

In accordance with yet another aspect of the present invention, a method for generating a Low Density Parity Check (LDPC) code in an LDPC encoding apparatus is provided. The method includes generating a use information vector by inserting a number of zeros b in an input information vector, and generating an LDPC code by encoding the use information vector using a parity-check matrix. Positions where the b zeros are inserted are positions corresponding to b variable nodes, the b variable nodes include variable nodes which are selected from stopping sets $S_d$ one by one using a selection scheme and the stopping sets $S_d$ are selected using the parity-check matrix.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of exemplary embodiments of the present invention will be more apparent from the following description taken in conjunction with the accompanying drawings in which.

Throughout the drawings, it should be noted that like references numbers are used to depict the same or similar elements, features and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide an apparatus and method for generating a Low Density Parity Check (LDPC) code. Further, exemplary embodiment of the present invention provide an apparatus and method for controlling positions where zeros are inserted when zeros are inserted in an input information vector to support various information vector lengths during the generation of the LDPC code.

Before a description of exemplary embodiments of the present invention is given, the terms used herein will be defined below.

The term 'cycle' denotes a loop created by connecting variable nodes to check nodes with edges in a bipartite graph of an LDPC code. A 'cycle length' denotes the number of edges forming the loop. For instance, when the cycle length is assumed to be '2d', the cycle with a length of 2d represents a loop created by connecting d variable nodes to d check nodes with edges.

Figure 1:
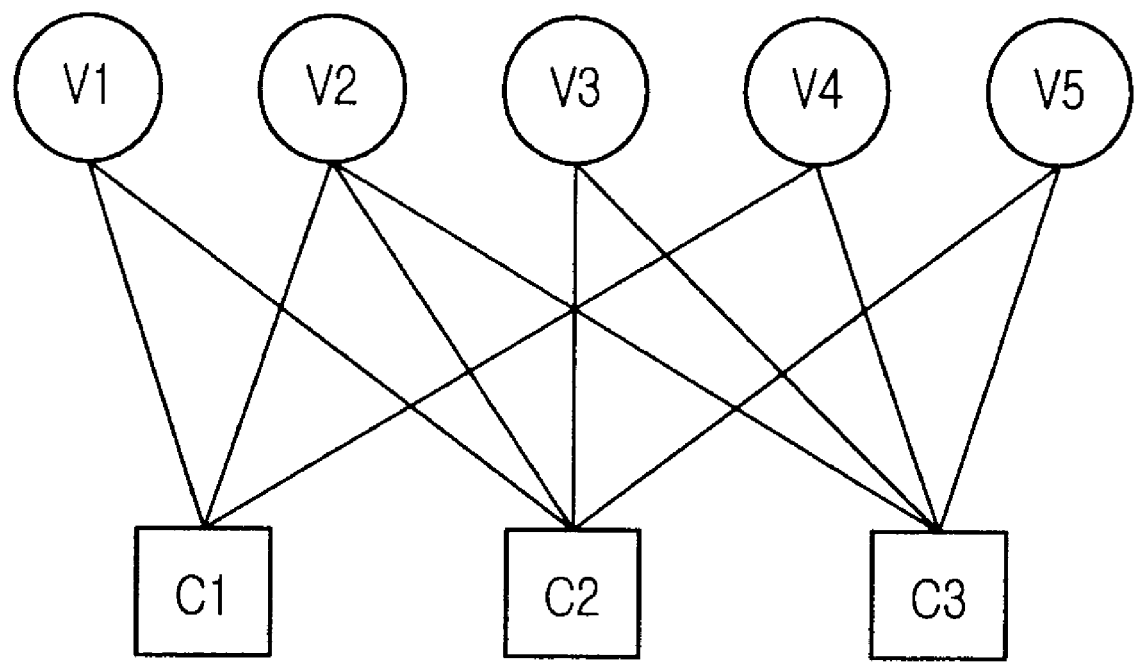
FIG. 1 is a diagram illustrating a parity-check matrix of a Low Density Parity Check (LDPC) code and the parity-check matrix bipartite graph according to an exemplary embodiment of the present invention.

A 'cycle set' $C_d$ includes d variable nodes and d variable nodes included in the cycle set $C_d$ and their neighboring check nodes create more than one cycle. With reference to FIG. 1, the cycle set is described below.

FIG. 1 is a diagram illustrating a parity-check matrix of an LDPC code and the parity-check matrix bipartite graph according to an exemplary embodiment of the present invention.

Referring to FIG. 1, H represents a parity-check matrix of an LDPC code, v1, v2, v3, v4 and v5 represent variable nodes included in a bipartite graph corresponding to the parity-check matrix and c1, c2 and c3 represent check nodes included in the bipartite graph. In FIG. 1, $v_1$-$c_1$-$v_2$-$c_2$ creates a cycle with a length of four (4), and $\{v_1, v_2\}$ becomes a cycle set $C_2$.

A stopping set $S_d$ includes d variable nodes and all check nodes neighboring the d variable nodes included in the stopping set $S_d$ are connected to the d variable nodes at least twice. It is well known that a stopping set $S_d$ includes a cycle, except for a bipartite graph in which only one variable node is connected to a check node. Generally, the stopping set $S_d$ includes a plurality of cycles. The stopping set $S_d$ will be described below with reference to FIG. 1.

In FIG. 1, check nodes $c_1$, $c_2$ and $C_3$ neighbor or connect to variable nodes $v_1$, $v_2$ and $v_3$. The check nodes $c_1$, $c_2$ and $C_3$ are connected to the variable nodes $v_1$, $v_2$ and $v_3$ at least twice, respectively. Thus, the variable nodes $\{v_1, v_2, v_3\}$ generate a stopping set $S_3$.

With regard to the stopping set $S_d$ described with reference to FIG. 1, values of elements included in a column created by adding all columns of a parity-check matrix corresponding to variable nodes included in the stopping set $S_d$ are all two (2) or more. This indicates that values of elements corresponding to check nodes connected to variable nodes included in the stopping set $S_d$ are two (2) or more. For example, in the parity-check matrix, elements included in a column created by adding all columns corresponding to variable nodes $v_1$, $v_2$ and $v_3$ included in a stopping set $S_3$ may be expressed as Equation (1).

$$\begin{bmatrix} 1 \\ 1 \\ 0 \end{bmatrix} + \begin{bmatrix} 1 \\ 1 \\ 1 \end{bmatrix} + \begin{bmatrix} 0 \\ 1 \\ 1 \end{bmatrix} = \begin{bmatrix} 2 \\ 3 \\ 2 \end{bmatrix} \quad (1)$$

It may be appreciated that since values of elements of a column generated by adding all columns corresponding to the variable nodes $v_1$, $v_2$ and $v_3$ of a parity-check matrix are all two (2) or more as illustrated in Equation (1), values of check nodes connected to the variable nodes $v_1$, $v_2$ and $v_3$ are all two (2) or more.

Thus, a method for determining a stopping set $S_d$ is described as follows.

If values of elements included in a column generated by adding all columns corresponding to d variable nodes in a parity-check matrix are all two (2) or more, the method determines that the d variable nodes create a stopping set $S_d$. By contrast, if all the values are not two (2) or more, the method determines that the d variable nodes do not create a stopping set $S_d$.

Figure 2:
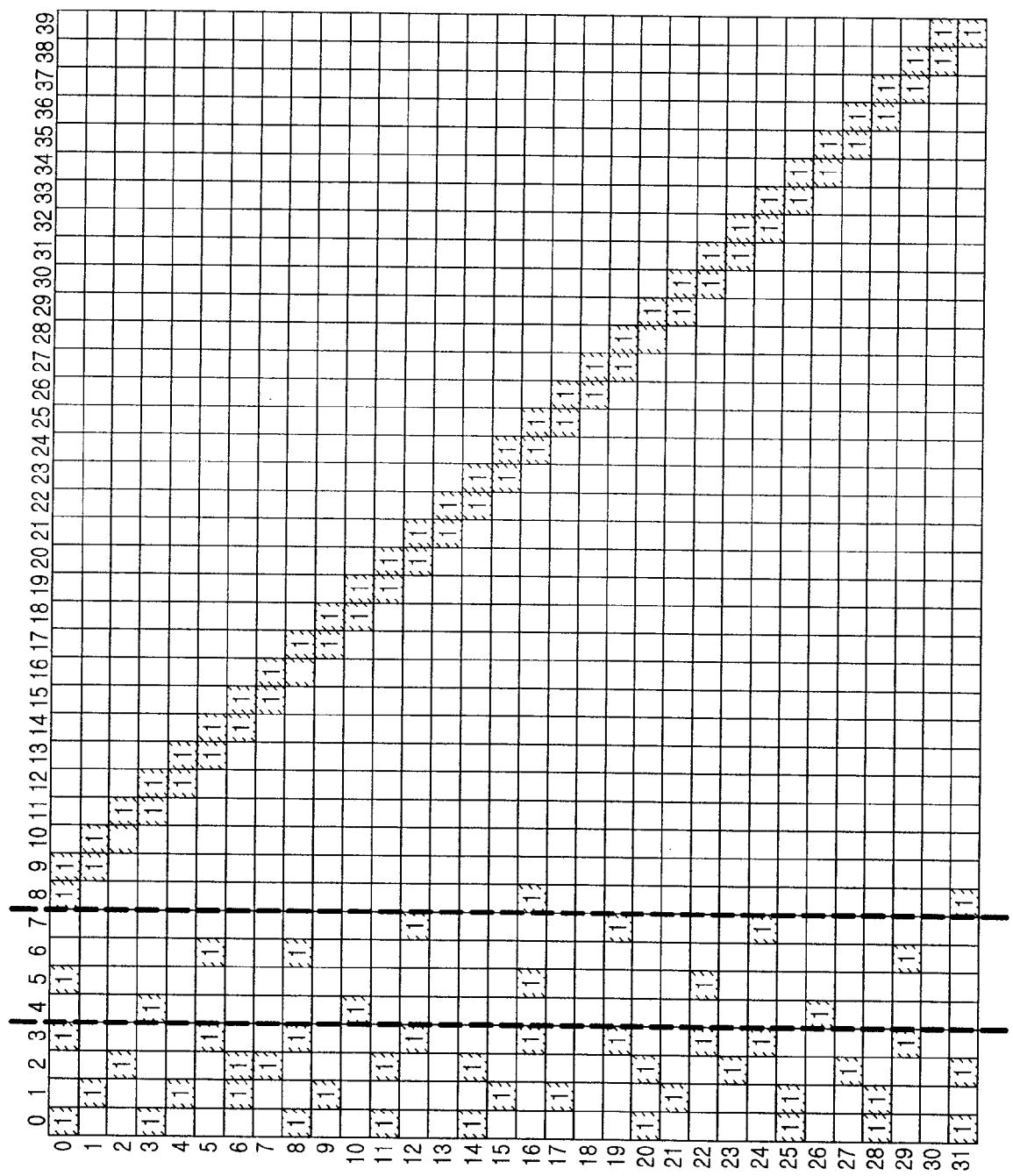
FIG. 2 is a diagram illustrating a parity-check matrix of an LDPC code including a 1/5 code rate according to an exemplary embodiment of the present invention.

With reference to FIG. 2, a method for determining a stopping set $S_d$ according to an exemplary embodiment of the present invention is described below.

FIG. 2 is a diagram illustrating a parity-check matrix of an LDPC code with a 1/5 code rate according to an exemplary embodiment of the present invention.

Referring to FIG. 2, the parity-check matrix size is 32×40. The column weights included in the parity-check matrix have distributions of 9, 3 and 2. In other words, column indexes 0 to 3 have column weights that are 9, column indexes 4 to 7 have column weights that are 3, and column indexes 8 to 39 have column weights that are 2. Among the blocks included in the parity-check matrix illustrated in FIG. 2, blocks that do not have a value of '1' written therein indicate that the blocks include the elements having a value of '0'.

Meanwhile, when a codeword vector of an LDPC code generated using the parity-check matrix illustrated in FIG. 2 is divided into an information vector and a parity vector, the codeword vector may be expressed as Equation (2).

$$c=(u_0,u_1,\ldots,u_7; p_0, p_1, p_{31}) \quad (2)$$

In FIG. 2, if variable nodes included in a bipartite graph corresponding to the parity-check matrix are defined as $v_i$ (where i=0~39), it may be appreciated that since values of elements included in a column created by adding all columns corresponding to variable nodes $v_3$, $v_5$, $v_6$ and $v_7$ are all two (2) or more, the variable nodes $v_3$, $v_5$, $v_6$ and $v_7$ create a stopping set $S_4$.

A linearly dependent set $L_d$ includes d variable nodes. In a parity-check matrix, columns corresponding to the d variable nodes are linearly dependent. Arbitrary subsets of columns corresponding to the d variable nodes are linearly independent. An LDPC code with a minimum distance $d_{min}$ has at least one linearly dependent set $L_{dmin}$ and fails to have a linearly dependent set $L_d$ with d<$d_{min}$. It is well known that a set of variable nodes creating a linearly dependent set $L_d$ always generate a stopping set $S_d$.

The linearly dependent set, with reference to FIG. 1, will be described below.

Referring to FIG. 1, it may be understood that variable nodes $v_3$ and $v_5$ create a linearly dependent set $L_2$. Therefore, it may be noted that the parity-check matrix illustrated in FIG. 1 is an LDPC code with a minimum distance $d_{min}$ of two (2).

Meanwhile, since an LDPC code having a cycle with a critical length, e.g., a length of four (4) or below, makes it impossible to acquire decoding information from other variable nodes during decoding, it is well known that acquiring decoding information from other variable nodes during decoding must be avoided during the design of the LDPC code to increase performance of the LDPC code.

Further, in order to improve performance of the LDPC code, it is important to maximize a minimum distance $d_{min}$ of the LDPC code.

Figure 3:
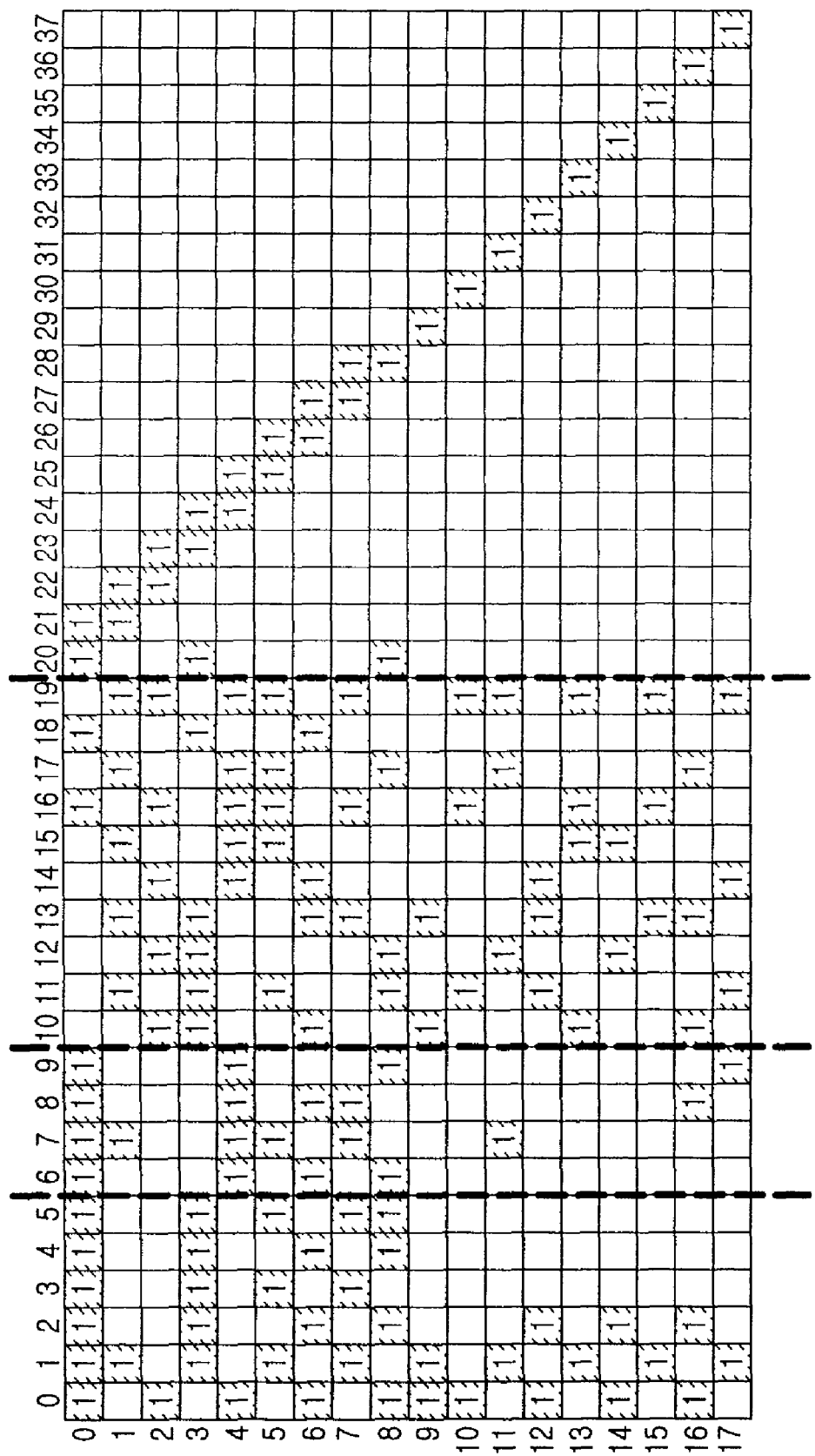
FIG. 3 is a diagram illustrating a parity-check matrix of an LDPC code including a 10/19 code rate according to an exemplary embodiment of the present invention.

Although a parity-check matrix for a codeword vector, i.e., LDPC code, with a length of five (5) is illustrated in FIG. 1, a parity-check matrix for a codeword vector with a length of forty (40) is illustrated in FIG. 2. A parity-check matrix for a codeword vector with a length of thirty-eight (38) is illustrated in FIG. 3. An actual length of the codeword vector may range from several thousand to several tens of thousands. An actual length of an information vector may also range from several hundred to several thousand.

Since the length of the information vector and the length of the codeword vector are so long, it is difficult to detect a high-performance LDPC code by calculating the minimum distance with the currently available computing power. In other words, it is difficult to calculate d variable nodes of a linearly dependent set $L_d$ and increase its value to improve performance of the LDPC code.

Therefore, when the inclusion relationship between the stopping set $S_d$ and the linearly dependent set $L_d$ is considered, in order to increase the minimum distance $d_{min}$, it is possible to leave only the stopping sets $S_d$ with large d variable nodes by removing the stopping sets $S_d$ with fewer d variable nodes in an indirect way, instead of increasing d variable nodes of the linearly dependent set $L_d$ including the minimum number of variable nodes in the desired parity-check matrix.

As a result, it is possible to improve performance of the LDPC code in the foregoing manner during the process of designing the LDPC code.

Meanwhile, when a parity-check matrix of an LDPC code has already been determined, detecting the stopping sets $S_d$ is easier than detecting the linearly dependent sets $L_d$. In other words, though it is difficult to detect a minimum distance of an LDPC code, it is easy to detect some stopping sets $S_d$ with fewer d variable nodes among all stopping sets $S_d$ existing in the corresponding LDPC code. Thus, it is possible to increase performance of an LDPC code by removing stopping sets $S_d$ with fewer d variable nodes when designing the LDPC code. Substantially, during the design of an LDPC code, it is possible to remove stopping sets $S_d$ with fewer d variable nodes to some extent. However, even though the stopping sets $S_d$ are removed, it is general that stopping sets $S_d$ always exist in a bipartite graph of the LDPC code.

Therefore, exemplary embodiments of the present invention propose a method for increasing performance of an LDPC code by determining positions corresponding to variable nodes included in the stopping sets $S_d$ as zero-insertion positions. In light of characteristics of the stopping set $S_d$, if a decoding apparatus may recover even an information bit corresponding to at least one variable node among the variable nodes included in the stopping set $S_d$, the possibility significantly decreases such that information bits corresponding to all variable nodes included in the stopping set $S_d$ will not be recovered. Therefore, with reference to FIGS. 2 and 3, a method for inserting zeros in positions corresponding to particular variable nodes among variable nodes included in the stopping set $S_d$ is described below. Herein, an operation of detecting a stopping set $S_d$ and determining positions where zeros are inserted in an information vector is carried out by an encoding apparatus.

With reference to FIG. 2, an exemplary method in which an encoding apparatus inserts one zero in an information vector is described below.

A length of an input information vector will be assumed to be seven (7). However, the parity-check matrix illustrated in FIG. 2 is a parity-check matrix available when the length of its information vector is eight (8). Thus, one zero should be inserted in the length-7 information vector. For convenience, a desired information vector to be created into an LDPC code will be referred to as an 'input information vector'. An information vector using a determined parity-check matrix will be referred to as a 'use information vector'. Meanwhile, using a selection scheme, the encoding apparatus determines a position corresponding to one variable node among variable nodes included in a stopping set $S_d$ with the minimum d value among the stopping sets detected from the parity-check matrix of FIG. 2, as a position where zero is inserted. The selection scheme is a scheme of randomly selecting one variable node.

For example, assuming that a stopping set $S_4$ $\{v_3, v_5, v_6, v_7\}$ is a stopping set $S_d$ having the minimum d value among the stopping sets detected from the parity-check matrix, a position corresponding to one variable node which is selected from the variable nodes $v_3, v_5, v_6, v_7$ using the selection scheme becomes a position where zero is inserted. For instance, assuming that $v_3$ out of the variable nodes $v_3, v_5, v_6$ and $v_7$ is selected, the encoding apparatus inserts zero in a position corresponding to the $v_3$ when inserting zero in the input information vector.

Accordingly, when inserting one zero in an input information vector, the encoding apparatus determines, as a position where zero is inserted, a position corresponding to one variable node which is selected using the selection scheme from variable nodes included in a stopping set $S_d$ having the minimum d value among the stopping sets detected from a parity-check matrix.

With reference to FIG. 3, an exemplary method in which an encoding apparatus inserts more than two (2) zeros in an input information vector is described below.

Referring to FIG. 3, the parity-check matrix size is 18×38. Among the blocks included in the parity-check matrix illustrated in FIG. 3, blocks that do not include a value of '1' written therein indicate that the blocks all include only the elements having a value of '0'.

Meanwhile, when a codeword vector of an LDPC code generated using the parity-check matrix illustrated in FIG. 3 is divided into an information vector and a parity vector. The codeword vector may be expressed as Equation (3).

$$c = (u_0, u_1, \ldots, u_{19}; p_0, p_1, p_{17}) \qquad (3)$$

An assumption is made that a length of an input information vector is sixteen (16). However, the parity-check matrix illustrated in FIG. 3 is a parity-check matrix available when a length of its use information vector is twenty (20). Thus, four (4) zeros should be inserted in the length-sixteen (16) information vector. In this case, a total of four (4) stopping sets $S_d$ are detected among the stopping sets detected from the parity-check matrix of FIG. 3. Herein, the total of four (4) stopping sets $S_d$ include stopping sets $S_d$ having increasingly larger d variable nodes beginning from the stopping set $S_d$ having minimum d variable nodes among the stopping sets detected from the parity-check matrix. Variable nodes included in each of the total of four (4) stopping sets $S_d$ are different from each other. The encoding apparatus selects one variable node from each of the detected four (4) stopping sets $S_d$ using the selection scheme and determines positions corresponding to the selected variable nodes as positions where zeros are inserted.

For example, it is assumed in FIG. 3 that a total of four (4) stopping sets $S_d$ having increasingly larger d variable nodes, from the stopping set $S_d$ having minimum d variable nodes, are $\{v_0, v_1, v_2, v_{19}\}$, $\{v_3, v_4, v_5, v_{18}\}$, $\{v_6, v_7, v_8, v_{18}\}$ and $\{v_9, v_{10}, v_{11}, v_{13}, v_{16}\}$. As such, the encoding apparatus selects one variable node from each of the four (4) stopping sets $S_d$ $\{v_0, v_1, v_2, v_{19}\}$, $\{v_3, v_4, v_5, v_{18}\}$, $\{v_6, v_7, v_8, v_{17}\}$ and $\{v_9, v_{10}, v_{11}, v_{13}, v_{16}\}$ using the selection scheme and determines positions corresponding to the selected variable nodes as positions where zeros are inserted. For instance, if it is assumed in FIG. 3 that the variable nodes $v_0, v_3, v_6$ and $v_9$ are selected as positions where zeros are inserted, zeros are inserted in the positions corresponding to the variable nodes $v_0, v_3, v_6$ and $v_9$.

In other words, in an exemplary embodiment of the present invention, when inserting N (N≧2) zeros in an input information vector, the encoding apparatus detects a total of N stopping sets $S_d$ among the stopping sets. Herein, the total of N stopping sets $S_d$ include stopping sets $S_d$ having increasingly larger d variable nodes from the stopping set $S_d$ having minimum d variable nodes among the stopping sets $S_d$ found from the parity-check matrix. The variable nodes included in each of the total of N stopping sets $S_d$ are different from each other. The encoding apparatus selects one variable node from each of the detected N stopping sets $S_d$ using the selection scheme and determines positions corresponding to the selected variable nodes as positions where zeros are inserted.

Figure 4:
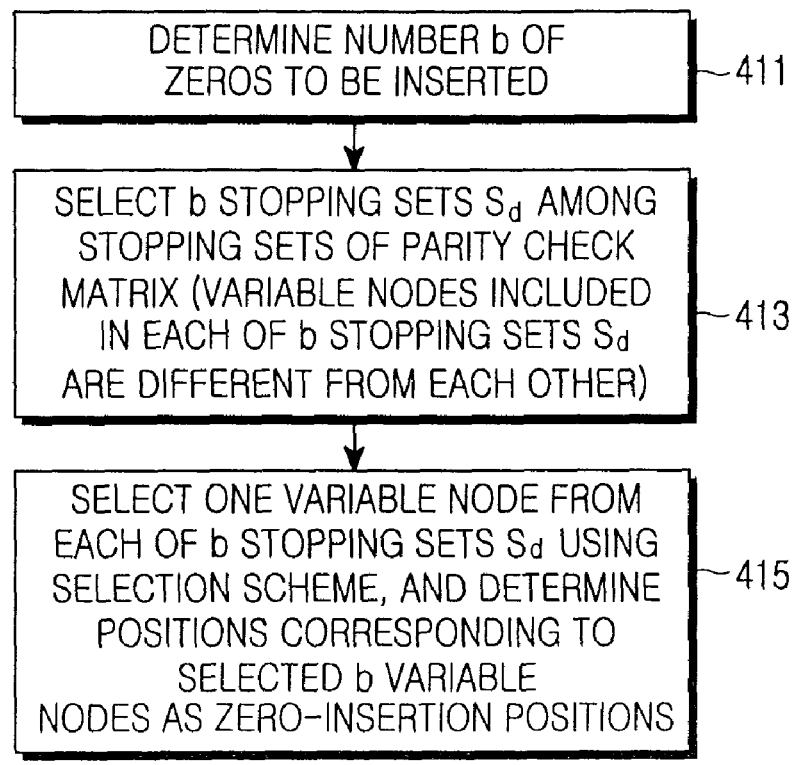
FIG. 4 is a flowchart illustrating a process of determining positions where zeros are inserted in an input information vector according to an exemplary embodiment of the present invention.

With reference to FIG. 4, a method for determining positions where zeros are inserted in an input information vector according to an exemplary embodiment of the present invention will be described below.

FIG. 4 is a flowchart illustrating a process of determining positions where zeros are inserted in an input information vector according to an exemplary embodiment of the present invention.

Referring to FIG. 4, the encoding apparatus determines a number of zeros b to be inserted in an input information vector in step 411. The encoding apparatus determines the b zeroes using a length of the input information vector and a length of a use information vector of a parity-check matrix. In step 413, the encoding apparatus selects a total of b stopping sets $S_d$ having increasingly larger d variable nodes beginning from the stopping set $S_d$ having minimum d variable nodes among the stopping sets $S_d$ detected from the parity-check matrix. The encoding apparatus selects the total of b stopping sets $S_d$ such that variable nodes included in each of the b stopping sets $S_d$ are different from each other. The reason for selecting the b stopping sets $S_d$ such that variable nodes included in each of the b stopping sets $S_d$ are different from each other is because when variable nodes included in each of the b stopping sets $S_d$ are equal to each other, if zeros are inserted in the positions corresponding to the same variable nodes, it is possible for a decoding apparatus to recover information bits corresponding to variable nodes included in all stopping sets $S_d$ including all the same variable nodes. In step 415, the encoding apparatus selects one variable node from each of the selected b stopping sets $S_d$ using the selection scheme and determines positions corresponding to the selected b variable nodes as positions where zeros are to be inserted.

Although not illustrated in FIG. 4, the encoding apparatus generates a codeword vector or LDPC code by encoding the zero-inserted information vector using the parity-check matrix.

Figure 5:
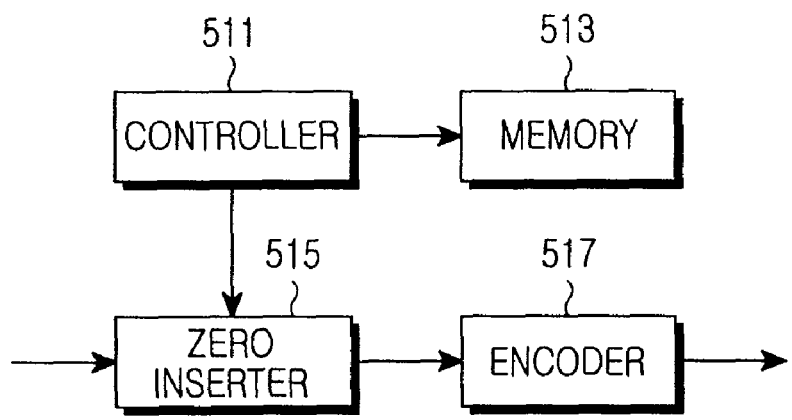
FIG. 5 is a diagram illustrating an internal structure of an encoding apparatus according to an exemplary embodiment of the present invention.

With reference to FIG. 5, an internal structure of an encoding apparatus according to an exemplary embodiment of the present invention is described below.

FIG. 5 is a diagram illustrating an internal structure of an encoding apparatus according to an exemplary embodiment of the present invention.

Referring to FIG. 5, the encoding apparatus includes a controller 511, a memory 513, a zero inserter 515 and an encoder 517. When an input information vector is input to the encoding apparatus, the input information vector is delivered to the zero inserter 515. The controller 511 determines the b zeros to be inserted by comparing a length of the input information vector delivered to the zero inserter 515 to a length of a use information vector of the parity-check matrix that the encoding apparatus uses. The memory 513 stores positions where zeros are to be inserted, which are determined in the manner described in FIG. 4. The controller 511 outputs information on the determined zero-insertion positions to the zero inserter 515. The zero inserter 515 inserts zeros in the input information vector according to the zero-insertion position information output from the controller 511. The zero inserter 515 also outputs the zero-inserted information vector to the encoder 517. The encoder 517 encodes the zero-inserted information vector using the parity-check matrix, generating an LDPC code.

As is apparent from the foregoing description, when zeros are inserted in an input information vector during LDPC encoding to support various information vector lengths, exemplary embodiments of the present invention improve performance of an LDPC code by controlling the zero-insertion positions.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for generating a Low Density Parity Check (LDPC) code in an LDPC encoding apparatus, the method comprising:
    determining a number of zeros b to be inserted in an input information vector when a length of the input information vector is less than a length of a use information vector of a parity-check matrix;
    selecting b stopping sets $S_d$ using the parity-check matrix;
    selecting one variable node from each of the b stopping sets $S_d$ using a selection scheme; and
    determining positions corresponding to the selected variable node from each of the b stopping sets $S_d$ as positions where zeros are to be inserted.

2. The method of claim 1, wherein the selection scheme comprises a random selection scheme.

3. The method of claim 1, further comprising generating a use information vector by inserting zeros in the input information vector according to the determined zero-insertion positions.

4. The method of claim 1, further comprising generating an LDPC code by encoding the use information vector using the parity-check matrix.

5. A Low Density Parity Check (LDPC) encoding apparatus comprising:
    a controller for determining a number of zeros b to be inserted in an input information vector when a length of the input information vector is less than a length of a use information vector of a parity-check matrix, for selecting b stopping sets $S_d$ using the parity-check matrix, for selecting one variable node from each of the b stopping sets $S_d$ using a selection scheme, for determining positions corresponding to the selected variable node from each of the b stopping sets $S_d$ as positions where zeros are to be inserted and for outputting information on the positions where zeros are to be inserted.

6. The LDPC encoding apparatus of claim 5, wherein the selection scheme comprises a random selection scheme.

7. The LDPC encoding apparatus of claim 5, further comprising a zero inserter for generating a use information vector by inserting zeros in the input information vector according to the information.

8. The LDPC encoding apparatus of claim 7, wherein the zero inserter outputs a zero inserted information vector to the encoder.

9. The LDPC encoding apparatus of claim 5, further comprising an encoder for generating an LDPC code by encoding the use information vector using the parity-check matrix.

10. The LDPC encoding apparatus of claim 5, further comprising a memory for storing positions where zeros are to be inserted.

11. A method for generating a Low Density Parity Check (LDPC) code in an LDPC encoding apparatus, the method comprising:
    generating a use information vector by inserting a number of zeros b in an input information vector; and
    generating an LDPC code by encoding the use information vector using a parity-check matrix;
    wherein positions where the b zeros are inserted comprise positions corresponding to b variable nodes, the b variable nodes comprise variable nodes which are selected from stopping sets $S_d$ one by one using a selection scheme and the stopping sets $S_d$ are selected using the parity-check matrix.

12. The method of claim 11, wherein the selection scheme comprises a random selection scheme.

13. A Low Density Parity Check (LDPC) encoding apparatus comprising:
    a zero inserter for generating a use information vector by inserting a number of zeros b in an input information vector; and
    an encoder for generating an LDPC code by encoding the use information vector using a parity-check matrix;
    wherein positions where the b zeros are inserted comprise positions corresponding to b variable nodes, the b variable nodes comprise variable nodes which are selected from stopping sets $S_d$ one by one using a selection scheme and the stopping sets $S_d$ are selected using the parity-check matrix.

14. The LDPC encoding apparatus of claim 13, wherein the selection scheme comprises a random selection scheme.

15. The LDPC encoding apparatus of claim 13, wherein the zero inserter outputs a zero inserted information vector to the encoder.

16. The LDPC encoding apparatus of claim 13, further comprising a memory for storing positions where zeros are to be inserted.

* * * * *